(12) United States Patent
Krüger et al.

(10) Patent No.: US 8,249,323 B2
(45) Date of Patent: Aug. 21, 2012

(54) METHOD FOR AUTOMATIC QUALITY CONTROL OF DATA IN IN-VIVO IMAGES

(75) Inventors: Gunnar Krüger, Erlangen (DE); Bénédicte Mortamet, Lausanne (CH)

(73) Assignee: Siemens Schweiz AG, Zurich (CH)

( * ) Notice: Subject to any disclaimer, the term of this patent is extended or adjusted under 35 U.S.C. 154(b) by 500 days.

(21) Appl. No.: 12/569,965

(22) Filed: Sep. 30, 2009

(65) Prior Publication Data
US 2010/0086184 A1    Apr. 8, 2010

(30) Foreign Application Priority Data
Sep. 30, 2008 (EP) .................................. 08017181

(51) Int. Cl.
*G06K 9/00* (2006.01)
*G06K 9/46* (2006.01)

(52) U.S. Cl. ...................................... 382/128; 382/170
(58) Field of Classification Search .................. 382/128, 382/168, 170, 181, 195; 600/312, 407, 431, 600/437, 476; 424/1.49
See application file for complete search history.

(56) References Cited

U.S. PATENT DOCUMENTS

| | | | | |
|---|---|---|---|---|
| 6,120,445 | A * | 9/2000 | Grunwald | 600/437 |
| 7,274,810 | B2 * | 9/2007 | Reeves et al. | 382/128 |
| 7,400,754 | B2 * | 7/2008 | Jung et al. | 382/128 |
| 7,477,931 | B2 * | 1/2009 | Hoyt | 600/476 |
| 7,657,071 | B2 * | 2/2010 | Bartesaghi et al. | 382/128 |
| 7,873,407 | B2 * | 1/2011 | Levenson et al. | 600/476 |
| 2010/0086184 | A1 * | 4/2010 | Kruger et al. | 382/128 |
| 2011/0085717 | A1 * | 4/2011 | Matsuda | 382/128 |

OTHER PUBLICATIONS

Van Leemput, et al., "Automated Model-Based Tissue Classification of MR Images of the Brain", IEEE Transactions on Medical Imaging, Oct. 1999, pp. 897-908, vol. 18, No. 10.
Wu, et al., "Automated segmentation of multiple sclerosis lesion subtypes with multichannel MRI", Apr. 5, 2006, NeuroImage 32, pp. 1205-1215.
Hendrick, et al., "Maximizing Signal-to-Noise and Contrast-to-Noise Ratios in Flash Imaging", 1987, Magnetic Resonance Imaging, pp. 117-127, vol. 5.
Henkelman, "Measurement of signal intensities in the presence of noise in MR images", Mar. 1985, Medical Physics, pp. 232-233, vol. 12, No. 2.

(Continued)

*Primary Examiner* — Amir Alavi
(74) *Attorney, Agent, or Firm* — Laurence A. Greenberg; Werner H. Stemer; Ralph E. Locher

(57) ABSTRACT

A method for quality control assessment in single time-point in-vivo imaging data related to imaging of objects, includes acquiring an in-vivo image of the object with imaging apparatus, defining a background image corresponding to an imaged air of the in-vivo image, defining an object image corresponding to the in-vivo image from which the background image has been removed, obtaining the background and object images by atlas-based registration, reflecting an intensity distribution of the background image with a histogram, fitting a noise mathematical model to part of the histogram intensity distribution, deriving background quality characteristics from the noise mathematical model, reflecting an intensity distribution of the object image with a further histogram, fitting a signal mathematical model to the further histogram intensity distribution, deriving object quality characteristics from the signal mathematical model, and automatically deriving signal-to-noise and contrast-to-noise ratios of in-vivo imaging data from the object quality and background quality characteristics.

8 Claims, 1 Drawing Sheet

OTHER PUBLICATIONS

Magnotta, et al., "Measurement of Signal-to-Noise and Contrast-to-Noise in the fBIRN Multicenter Imaging Study", Jun. 2006, Journal of Digital Imaging, pp. 140-147, vol. 19, No. 2.

Kaufman, et al., "Measuring Signal-to-Noise Ratios in MR Imaging", Oct. 1989, Radiology, pp. 265-267.

Constantinides, et al., "Signal-to-Noise Measurements in Magnitude Images from NMR Phased Arrays", 1997, Magnetic Resonance in Medicine, pp. 852-857, vol. 38, Issue 5.

Duda, et al: "Pattern Classification and Scene Analysis", (E 1524), 1973, pp. 43-81, Stanford Research Institute, Menlo Park, California.

* cited by examiner

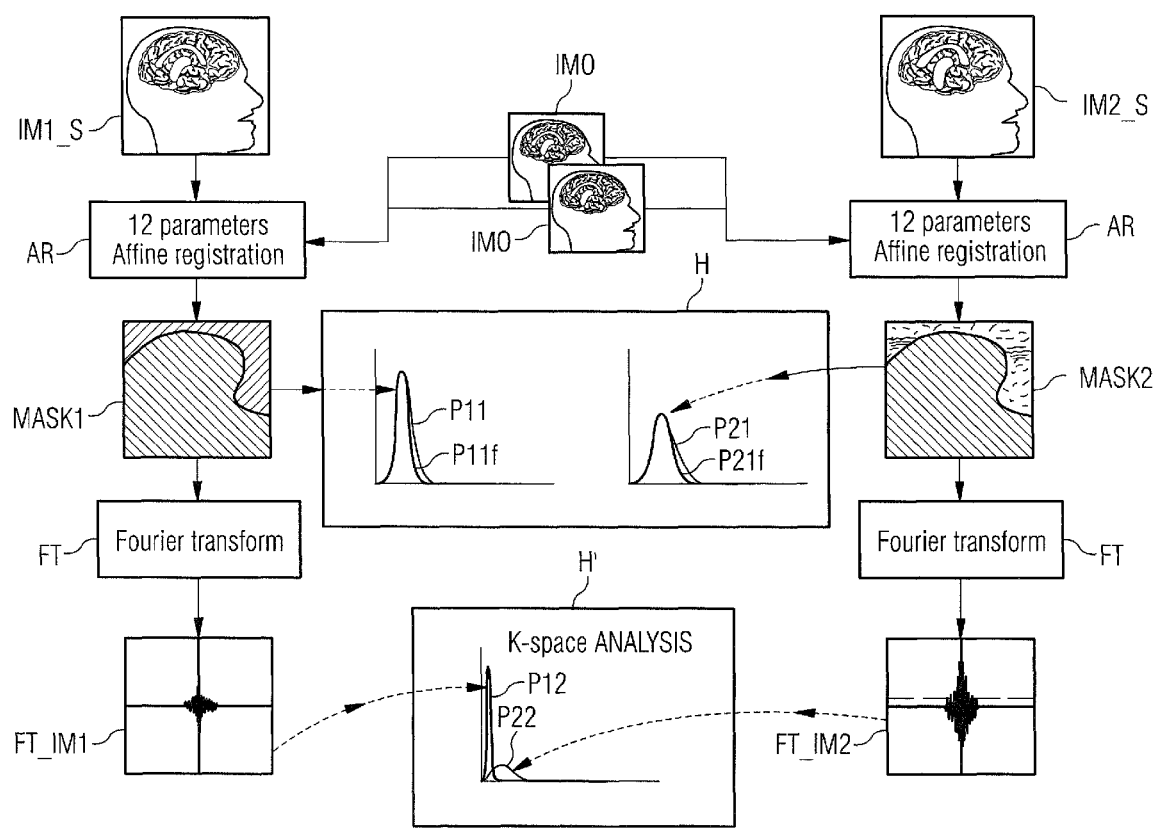

METHOD FOR AUTOMATIC QUALITY CONTROL OF DATA IN IN-VIVO IMAGES

CROSS-REFERENCE TO RELATED APPLICATION

This application claims the priority, under 35 U.S.C. §119, of European Patent Application EP 08 017 181.2, filed Sep. 30, 2008; the prior application is herewith incorporated by reference in its entirety.

BACKGROUND OF THE INVENTION

Field of the Invention

The invention relates to a method for automatically providing quality control assessments in single time-point in-vivo imaging data related to the imaging of objects.

The proposed invention intends to achieve quality control assessments of in-vivo single time-point imaging data in an automated manner and especially MR based data (Magnetic Resonance based imaging data). Quality control of MR-Images is of great importance as it strongly influences the significance and reliability of diagnostic conclusions drawn from their analysis. Standard procedures include measurements of Signal-to-Noise Ratio (abbreviated as SNR) and Contrast-to-Noise Ratio (abbreviated as CNR) that require a high level of user interaction.

In order to determine SNR from a single image, the most commonly used technique is based on imaging signal statistics focused on delineation of two separate regions of interest (abbreviated as ROIs): one in the tissue of interest (i.e. brain tissue) to determine a signal intensity, the other in a background (i.e. air) to measure a noise intensity (see references [1,2]). Finding a suitable ROI of the background for in-vivo measurements requires user interaction which appears adequate to perform unitary tests but is not clinically acceptable to be routinely used since that procedure is tedious and error prone. At this time, no automated technique to define background ROIs from a single image acquisition has been used to derive quality control measurement or evaluation.

SUMMARY OF THE INVENTION

It is accordingly an object of the invention to provide a method for automatic quality control of data in in-vivo images, which overcomes the hereinafore-mentioned disadvantages of the heretofore-known methods of this general type and which provides effective quality control assessments in single time-point in-vivo imaging data in an automated manner, especially for MR based imaging data.

A method according to the invention is proposed for providing an automatic quality control of a single part of a human body (e.g. a brain) through the use of an MR image and is achieved in a process including following steps:

Firstly, a step of background delineation is performed on incoming imaging data from an imaging apparatus through the use of an affine transformation, such as a 12-parameter affine registration algorithm between a reference MR-image (which has been previously segmented into whole head and brain tissue and stored) and an incoming live in-vivo-image of the head.

This resulting transformation encodes a spatial voxel-by-voxel correspondence between both previous images that can be further applied to a reference labeled image (where a first label corresponds to a background related ROI and a second label corresponds to a brain tissue related ROI) to simultaneously provide a mask for each of the two ROIs: one for background (i.e. original image excluding all imaged tissue, leaving out only a so called "imaged air") and one for brain tissue.

Secondly, a model is fitted to an intensity distribution of the background ROI that can be provided under a form of histogram. This model formed of a chi based function (see reference [3]) is fitted to the histogram using maximum likelihood estimation (see reference [4]). An absolute difference that can be evaluated in real-time and automatically between some values of a histogram and the fitted model (that can be interpreted as a so-called residual) is an effective indicator of quality control assessment for dynamic in-vivo-imaging.

Thirdly, over all of the voxels of the mask related to brain tissue, a three-tissue class histogram can be modeled through the use of three Gaussian or similar distributions (gray/white matter and cerebrospinal fluid). Their mean and standard deviation are well suited to evaluate the quality of brain tissue signal intensity. Finally, an SNR estimator is calculated as a mean intensity of the signal divided by the standard deviation of the background noise derived from the above-outlined model. The CNR is evaluated as the difference between gray and white matter mean intensities divided by the standard deviation of the background noise derived from the above-outlined model.

Optionally, the method according to the invention can be tuned to be more sensitive to a particular artifact pattern (e.g. eye movement creates artifacts only along a phase-encoding direction). Introducing models with prior-knowledge about a spatial pattern of different artifact sources may allow a more detailed analysis of the background.

Hence, based on a single image capture (over complex, magnitude image or k-space based data), the proposed invention enables an automatic classification of imaged data quality and allows a further advantageous detection of subject-induced (physiological, motion, etc.), imaging apparatus or other scanner related artifacts prospectively or retrospectively.

A main advantage of the method proposed in the invention is that it allows quality measurements to be automatically derived from an MR image (in the previous example, from a human brain). It is a way to test the eligibility of data to further guarantee accurate and reproducible post-processing measurements, such as for a brain tissue classification.

Further advantages of this invention rely on the following:
a) a quality assurance analysis can be carried out on the background noise only, allowing the detection of ringing/ghosting artifacts (generally caused by bulk head motion), flow artifacts (due to blood or fluid flow within the brain) or system related artifacts (radiofrequences, spikes, etc) as they introduce high-intensity "noise" voxels, thus altering noise-related quantities as previously described,
b) a poor slice positioning, such as nose or chin wrap, can be detected during the first step (i.e. registration) since these head features are spatially encoded in the reference MR-Image.

The present invention therefore proposes a method for providing quality control assessments in single time-point in-vivo imaging data related to the imaging of objects, in an automated manner.

In summary, the method according to the invention for providing quality control assessments in single time-point in-vivo imaging data related to the imaging of objects comprises mainly the following steps:

at least one in-vivo image of the object is acquired by an imaging apparatus, a background image is defined to correspond to an imaged air of the in-vivo image, an object image is defined to correspond to the in-vivo image from which the background image has been removed, the background image and the object image are obtained by an atlas-based registration, a histogram is provided which reflects an intensity distribution of the background image, a noise mathematical model is fitted to at least a part of the intensity distribution of the histogram, characteristics of the quality of the background are derived from the noise mathematical model, a further histogram is provided that reflects an intensity distribution of the object image, a signal mathematical model is fitted to the intensity distribution of the further histogram, characteristics of the quality of the object are derived from the signal mathematical model, and a signal-to-noise ratio and a contrast-to-noise ratio of in-vivo imaging data are automatically derived from the characteristics of the quality of the object and from the characteristics of the quality of the background.

In accordance with another mode of the invention, the quality control assessment can be provided over data processing based on spatial or frequency coordinates. The method according to the invention is hence mathematically adaptable to a large field of physical imaging/computing methods.

In accordance with a further mode of the invention, the object can be divided into several compartments that are modeled mathematically in an independent manner, particularly in the case of a plurality of tissues. The method according to the invention is hence highly adaptable for complex in-vivo imaging of human body parts.

In accordance with an added mode of the invention, as an example, the object can be a brain on which each of three main tissue types, adapted to gray matter, white matter and cerebrospinal fluid, are mathematically modeled by a Gaussian or similar distribution. This segmentation in only three types of tissue is very effective in terms of automatically providing very good quality control assessment on imaging of the brain.

In accordance with an additional mode of the invention, more precisely, the signal-to-noise ratio can be simply calculated as a mean intensity of one of the three tissue types derived from the signal mathematical model divided by a standard deviation of the background intensities derived from the noise mathematical model.

In accordance with yet another mode of the invention, the contrast-to-noise ratio is also simply calculated as a difference between two tissue mean intensities derived from the signal mathematical model divided by a standard deviation of the background intensities derived from the noise mathematical model.

These calculations are advantageously able to be automated and executed under high rates that are well-suited for a dynamic quality control of in-vivo-imaging.

In accordance with a concomitant mode of the invention, a simple integral value of an evaluated absolute difference between the mathematical model and the histogram of the background can be used as a very effective predictor or indicator of the quality of the in-vivo-imaging.

Other features which are considered as characteristic for the invention are set forth in the appended claims.

Although the invention is illustrated and described herein as embodied in a method for automatic quality control of data in in-vivo images, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is an evaluation diagram of data quality according to the method of the invention, including a first set of high quality imaged data (on the left) and a second set of low quality imaged data.

DETAILED DESCRIPTION OF THE INVENTION

Referring now in detail to the single FIGURE of the drawing, there is seen an evaluation diagram of data quality according to the method of the invention, including a first set of high quality imaged data IM1_S (on the left) and a second set of low quality imaged data IM2_S, whereby:

at least one in-vivo image IM0 of the object is acquired by an imaging apparatus (such as a non-illustrated MR-apparatus), a background image MASK1, MASK2 is defined for the purpose of corresponding to an imaged air of the in-vivo image, an object image is defined for the purpose of corresponding to the in-vivo image from which the background image has been removed, the background image and the object image are obtained by an atlas based registration AR (=e.g. an affine transformation), a histogram H is provided which reflects an intensity distribution P11, P21 of the background image, a noise mathematical model P11$f$, P21$f$ is fitted to at least a part of the intensity distribution P11, P21 of the histogram H, characteristics of the quality of the background are derived from the noise mathematical model, in the same manner, a further histogram is provided that reflects an intensity distribution of the object image, a signal mathematical model is fitted to the intensity distribution of the further histogram, characteristics of the quality of the object are derived from the signal mathematical model, a signal-to-noise ratio and a contrast-to-noise ratio of in-vivo imaging data are automatically derived from the characteristics of the quality of the object and from the characteristics of the quality of the background.

The above-described quality control assessment is provided over data processing based on spatial coordinates, but as also shown in the FIGURE, the assessment can also be provided over data processing based on frequency coordinates through the use of a Fourier transform FT applied to the background images MASK1, MASK2. A similar histogram H' is provided over a frequency range and reflects an intensity distribution P12, P22 of a frequency based background image FT_IM1, FT_IM2 of each of a high/low quality set of imaging data. Principally, the method for providing quality control assessment under this configuration is the same as described above for the intensity distribution over spatial coordinates of imaged objects.

References

[1] Kaufman L, Kramer D M, Crooks L E, Ortendahl D A. Measuring signal-to-noise ratios in MR imaging. Radiology 1989; 173(1):265-267.
[2] Henkelman R M. Measurement of signal intensities in the presence of noise in MR images. Med Phys 1985; 12(2): 232-233.
[3] Constantinides C D, Atalar E, McVeigh E R. Signal-to-noise measurements in magnitude images from NMR phased arrays. MRM 1997; 38(5):852-857.
[4] Duda R O, Hart P E. Pattern Classification and Scene Analysis. Institute SR, editor, New York: Wiley; 1973.

The invention claimed is:

1. A method for providing quality control assessments in single time-point in-vivo imaging data related to the imaging of objects, the method comprising:
  acquiring at least one in-vivo image of an object with an imaging apparatus;
  defining a background image to correspond to an imaged air of the in-vivo image;
  defining an object image to correspond to the in-vivo image from which the background image has been removed;
  obtaining the background image and the object image by an atlas-based registration;
  providing a histogram (H) reflecting an intensity distribution of the background image;
  fitting a noise mathematical model to at least a part of the intensity distribution of the histogram (H);
  deriving characteristics of a quality of the background from the noise mathematical model;
  providing a further histogram (H) reflecting an intensity distribution of the object image;
  fitting a signal mathematical model to an intensity distribution of the further histogram (H);
  deriving characteristics of a quality of the object from the signal mathematical model; and
  automatically deriving a signal-to-noise ratio and a contrast-to-noise ratio of in-vivo imaging data from the characteristics of the quality of the object and from the characteristics of the quality of the background.

2. The method according to claim 1, which further comprises providing the quality control assessment over data processing based on spatial or frequency coordinates.

3. The method according to claim 1, which further comprises dividing the object into several compartments modeled mathematically in an independent manner.

4. The method according to claim 3, wherein the object is a brain on which each of three tissue types, adapted to gray matter, white matter and cerebrospinal fluid, are mathematically modeled by a Gaussian or similar distribution.

5. The method according to claim 4, which further comprises calculating the signal-to-noise ratio as a mean intensity of one of the three tissue types derived from the signal mathematical model divided by a standard deviation of the background intensities derived from the noise mathematical model.

6. The method according to claim 4, which further comprises calculating the contrast-to-noise ratio as a difference between two tissue mean intensities derived from the signal mathematical model divided by a standard deviation of the background intensities derived from the noise mathematical model.

7. The method according to claim 1, which further comprises dividing the object into several compartments modeled mathematically in an independent manner in the case of a plurality of tissues.

8. The method according to claim 1, which further comprises predicting or indicating a quality of in-vivo imaging using an integral value of an evaluated absolute difference between the mathematical model and the histogram of the background.

* * * * *